United States Patent
Iwanczyk et al.

(10) Patent No.: US 7,186,985 B2
(45) Date of Patent: Mar. 6, 2007

(54) METHOD AND APPARATUS FOR FABRICATING MERCURIC IODIDE POLYCRYSTALLINE FILMS FOR DIGITAL RADIOGRAPHY

(75) Inventors: Jan S. Iwanczyk, Los Angeles, CA (US); Bradley E. Patt, Sherman Oaks, CA (US)

(73) Assignee: DxRay, Inc., Northridge, CA (US)

( * ) Notice: Subject to any disclaimer, the term of this patent is extended or adjusted under 35 U.S.C. 154(b) by 266 days.

(21) Appl. No.: 10/158,494

(22) Filed: May 30, 2002

(65) Prior Publication Data

US 2003/0021382 A1     Jan. 30, 2003

Related U.S. Application Data

(60) Provisional application No. 60/308,967, filed on Jul. 30, 2001.

(51) Int. Cl.
G01T 1/24     (2006.01)
(52) U.S. Cl. ............... 250/370.09; 438/166; 438/97
(58) Field of Classification Search ........... 250/370.09; 438/166, 97
See application file for complete search history.

(56) References Cited

U.S. PATENT DOCUMENTS

| | | | |
|---|---|---|---|
| 4,030,964 A | | 6/1977 | Schieber et al. |
| 4,091,084 A | | 5/1978 | Schieber |
| 4,094,268 A | | 6/1978 | Schieber et al. |
| 4,581,218 A | | 4/1986 | Nicolau |
| 4,780,174 A | * | 10/1988 | Lan et al. ............ 117/101 |
| 5,241,987 A | | 9/1993 | Ohmi et al. |
| 5,892,227 A | * | 4/1999 | Schieber et al. ...... 250/370.12 |
| 6,855,859 B2 | * | 2/2005 | Nolan et al. ............ 423/107 |
| 2001/0041462 A1 | * | 11/2001 | Kashiwagi et al. ...... 438/787 |
| 2004/0195515 A1 | | 10/2004 | Wheeler et al. |
| 2004/0200974 A1 | | 10/2004 | Hermon et al. |
| 2005/0118527 A1 | | 6/2005 | Harel et al. |

FOREIGN PATENT DOCUMENTS

| | | |
|---|---|---|
| EP | 0 489 483 A1 | 6/1992 |
| EP | 1 000 948 B1 | 9/2002 |
| JP | 59-164635 | 9/1984 |
| JP | 2-284638 | 11/1990 |
| JP | 4-333569 | 11/1992 |
| JP | 6-244145 | 9/1994 |

(Continued)

OTHER PUBLICATIONS

Schieber et al. "Polycrystalline Mercuric Iodide Detectors" Jul. 1999, SPIE Conference on Medical Applications of Penetrating Radiation, vol. 3770, pp. 146-155.*

(Continued)

*Primary Examiner*—David Porta
*Assistant Examiner*—Christine Sung
(74) *Attorney, Agent, or Firm*—Christie, Parker & Hale, LLP

(57) ABSTRACT

A method is provided for fabricating in a thermal evaporation system a polycrystalline film capable of directly detecting radiation. Source material is placed in a container, and the container is evacuated to create vacuum within the container. The source material is heated to evaporate the source material for depositing on a substrate. The polycrystalline film is used in as deposited form to detect the radiation.

34 Claims, 9 Drawing Sheets

FOREIGN PATENT DOCUMENTS

| JP | 10-506989 | 7/1998 |
| JP | 11-218857 | 8/1999 |
| JP | 2000-239213 | 9/2000 |
| WO | WO 96/10194 | 4/1996 |

OTHER PUBLICATIONS

Mattox, D.M., "Handbook of Physical Vapor Deposition (PVD) Processing" 1998, William Andrew Publishing, Noyes,pp. 288-342.*

Hermon et al. "Deposition of thick films of polycrystalline mercuric iodide x-ray detectors", Jun. 2001, Proceedings of SPIE, vol. 4320, pp. 133-139.*

Lamonds, H.A., "Review of Mercuric Iodide Development Program in Santa Barbara," Nuclear Instruments and Methods 213, North-Holland Publishing Company, pp. 5-12, 1983.

Skinner, N.L., et al., "Preparation and Evaluation of Mercuric Iodide for Crystal Growth," Nuclear Instruments and Methods in Physics Research A283; North-Holland Physics Publishing Division, Amsterdam, pp. 119-122; May 26, 1989.

Patt, Bradley E., "Multi-Element Mercuric Iodide Detector Systems for X-Ray and Gamma-Ray Imaging," Mat. Res. Soc. Symp. Proc. vol. 302, pp. 43-54, 1993.

M. Schieber, R.C. Carlston, H.A. Lamonds, P.T. Randkte, F.W. Schnepple and J. Llacer; Purification, Growth and Characterization of Alpha Mercuric-Iodide Crystals for Gamma-Ray Detection; Journal of Crystal Growth; 1974; pp. 205-211; vol. 24/25; North-Holland Publishing; North-Holland.

M. Schieber, M. Roth and W.F. Schnepple; Crystal Growth and Applications of Mercuric Iodide; Journal of Crystal Growth; 1983; pp. 353-364; vol. 65; Elsevier Science Publishers B.V.; North-Holland, Amsterdam.

H.A. Lamonds; Review of Mercuric Iodide Development Program in Santa Barbara; 1983; pp. 5-12; vol. 213; Nuclear Instruments and Methods; North-Holland Publishing Co.; North-Holland.

M. Schieber; Introduction to Fifth International Workshop on Mercuric Iodide Nuclear Radiation Detectors; Nuclear Instruments and Methods; 1983; pp. 1-3; vol. 213; North-Holland Publishing Co.; North-Holland.

N.L. Skinner, et al.; Preparation and Evaluation of Mercuric Iodide for Crystal Growth; Nuclear Instruments and Methods in Physics Research; 1989; pp. 119-122; vol. A283; Elsevier Science Publishers B.V.; North-Holland, Amsterdam.

M. Schieber, et al.; Correlation Between Mercuric Iodide Detector Performance and Crystalline Perfection; Nuclear Instruments and Methods in Physics Research; 1989; pp. 172-187; vol. A283; Elsevier Science Publishers B.V.; North-Holland, Amsterdam.

H. Hermon, et al.; Electrical charge transport properties of $HgI_2$ intercalated with hydrocarbons and/or doped with excess mercury and iodine; Nuclear Instruments and Methods in Physics Research; Section A; 1992; pp. 442-448; vol. A322; Elsevier Science Publishers B.V.; North-Holland.

H. Hermon, et al.; Improved technique for $HgI_2$ crystal growth; Nuclear Instrument & Methods in Physics Research; Section A; 1992; pp. 432-434; vol. A322; Elsevier Science Publishers B.V.; North-Holland.

H. Hermon, et al.; On the Phase Diagram of Mercuric Iodide Near the Stoichiometric Composition; Mat. Res. Bull.; 1993; pp. 229-234; vol. 28; Pergamon Press; USA.

M. Schieber, et al.; Physical-Chemcial Considerations for Semiconductor Room-Temperature Radiation Detectors; Mat. Res. Soc. Symp. Proc.; 1993; pp. 347-355; vol. 302; Materials Research Society.

H. Hermon, et al.; Study of trapping levels in doped $HgI_2$ radiation detectors; Nuclear Instruments and Methods in Physics Research; Section A; 1996; pp. 10-13; vol. A380; Elsevier Science Publishers B.V.

M. Schieber, et al.; Novel Mercuric Iodide Polycrystalline Nuclear Particle Counters; IEEE Transactions on Nuclear Science; Dec. 1997; pp. 2571-2575; vol. 44, No. 6; IEEE.

M. Schieber, et al.; Ceramic Mercuric Iodide Semiconductor Particle Counters; 1998; pp. 77-81; IEEE.

M. Schieber, et al.; Towards Imaging with Polycrystalline Mercuric Iodide Semiconductor Detectors; Mat. Res. Soc. Symp. Proc.; 1998; pp. 329-337; vol. 487; Materials Research Society.

D.M. Mattox; Handbook of Physical Vapor Deposition (PVD) Processsing; 1998; pp. 288-342; William Andrew Publishing/Noyes.

M. Schieber, et al.; Polycrystalline mercuric iodide detectors; SPIE; Jul. 1999; pp. 146-155; vol. 3770; Part of the SPIE Conference on Medical Applications of Penetrating Radiation; Denver, Colorado.

M. Schieber, et al.; High flux X-ray response of composite mercuric iodide detectors; SPIE; Jul. 1999; pp. 296-309; vol. 3768; Part of the SPIE Conference on Hard X-ray, Gamma-Ray, and Neutron Detector Physics; Denver, Colorado.

R. Turchetta, et al.; Imaging with polycrystalline mercuric iodide detectors using VLSI readout; Nuclear Instruments and Methods in Physics Research; Section A; 1999; pp. 88-94; Elsevier Science B.V.

M. Schieber, et al.; Characterization studies of purified $HgI_2$ precursors; Nuclear Instruments & Methods in Physics Research; Section A; 1999; pp. 25-29; vol. A428; Elsevier Science B.V.

M. Schieber, et al., Radiological X-ray Response of Polycrystalline Mercuric Iodide Detectors; Medical Imaging 2000: Physics of Medical Imaging; 2000; pp. 48-55; vol. 3977; Proceedings of SPIE.

R. A. Street, et al.; High resolution x-ray image sensors based on $HgI_2$; Penetrating Radiation Systems and Applications II; 2000; pp. 189-196; vol. 4142; Proceedings of SPIE.

R. A. Street, et al.; High Resolution, Direct Detection X-Ray Imagers; 2000; SPIE MI.

R. A. Street, et al.; Comparative Study of $PbI_2$ and $HgI_2$ as Direct Detector Materials for High Resolution X-ray Image Sensors; Medical Imaging 2001: Physics of Medical Imaging; 2001; pp. 1-12; vol. 4320; Proceedings of SPIE.

H. Hermon, et al.; Electrical Properties of Polycrystalline Mercuric Iodide X-Ray Detectors; Penetrating Radiation Systems and Applications III; 2001; pp. 20-27; vol. 4508; Proceedings of SPIE.

M. Schieber, et al; Thick films of X-ray polycrystalline mercuric iodide detectors; Journal of Crystal Growth; 2001; pp. 118-123; Elsevier Science B.V.

H. Hermon, et al.; Deposition of thick films of polycrystalline mercuric iodide x-ray detectors; Medical Imaging 2001: Physics of Medical Imaging; Jun. 2001; pp. 133-139; vol. 4320; Proceedings of SPIE.

Y. Saado, et al.; Grain geometry effect on responsivity of semiconducting $HgI_2$/polymer x-ray detectors; X-Ray and Gamma-Ray Detectors and Applications IV; 2002; pp. 128-135; vol. 4784; Proceedings of SPIE.

R. A. Street, et al.; Comparative Study of $PbI_2$ and $HgI_2$ as Direct Detector Materials for High Resolution X-ray Image Sensors; 2002; SPIE MI.

G. Zentai, et al.; Large area mercuric iodide thick film X-ray detectors for fluoroscopic (on-line) imaging; 2002; SPIE NDT.

A. Zuck, et al.; Delayed emission of surface-generated trapped carriers in transient charge transport of single-crystal and polycrystalline $HgI_2$; X-Ray and Gamma-Ray Detectors and Applications IV; 2002; pp. 279-287; vol. 4784; Proceedings of SPIE.

M. Schieber, et al, Reviewing Polycrystalline Mercuric Iodide X-ray Detectors, IEEE Conference, 2004, pp. 4327-4331.

* cited by examiner

METHOD AND APPARATUS FOR FABRICATING MERCURIC IODIDE POLYCRYSTALLINE FILMS FOR DIGITAL RADIOGRAPHY

CROSS-REFERENCE TO RELATED APPLICATION(S)

This application claims priority of U.S. Provisional Patent Application No. 60/308,967 filed Jul. 30, 2001, entitled "Mercuric Iodide Polycrystalline Films and Method and Apparatus for Fabricating the Same," the contents of which are fully incorporated by reference herein.

STATEMENT REGARDING FEDERALLY SPONSORED RESEARCH OR DEVELOPMENT

This invention was made with government support received from National Institute of Health, Grant # 1R43GM62069. The Government has certain rights in this invention.

FIELD OF THE INVENTION

This invention is related to digital radiography, and particularly to a method and apparatus for fabricating mercuric iodide ($HgI_2$) polycrystalline films for digital radiography applications.

BACKGROUND OF THE INVENTION

Traditionally, photographic films have been used to perform X-ray imaging. Photographic film techniques have the advantages of good spatial resolution (better than 50 μm) and very large active areas. However, use of photographic films suffers from many drawbacks, including low X-ray detection efficiency, non-linearity, and slow image retrieval processes.

Thus, there currently is a growing interest in developing digital radiographic detectors for medical, scientific and industrial applications. The applications for digital radiographic detectors may include medical diagnostic applications, non-destructive evaluation of materials, X-ray diffraction of biological and other material samples, and astronomical observations. For example, some estimates indicate that, in the medical area alone, there are over 600 X-ray images produced per 1000 population per year, much of which may be performed using digital radiographic techniques.

Digital techniques in radiology typically have several benefits over traditional X-ray film analog methods. These include reduced radiation dose for an equivalent image, convenient image acquisition and retrieval (avoiding film development time and cost), digital image processing (image enhancement), computer-assisted diagnosis, and easy image storage and transmission. Furthermore, the ability to provide real time images may be advantageous in some applications.

Recently, amorphous silicon (a-Si:H) transistor-addressed arrays (amorphous silicon arrays) have become a leading technology for large area flat panel imaging. Imagers with up to 2304×3200 pixels (29.2×40.6 $cm^2$) on a single substrate with pitch of 127 μm have been produced, and several companies have started commercial production of the amorphous silicon arrays. Smaller area but higher spatial resolution X-ray imagers are also produced using single crystal silicon CMOS readout technology. The sensitivity to X-rays is obtained by coupling a phosphor screen to either the amorphous silicon array or the CMOS readout. Typically $Gd_2O_2S$:Tb phosphor is deposited on the amorphous silicon array-based imagers, although CsI:Tl has also been used.

The detectors utilizing phosphors can be characterized as indirect detectors, which typically require a combination of processes to achieve an image. First, transfer of the X-ray energy into visible light photons by the phosphor should be accomplished, and then subsequently the light should be converted into electrical signals using light sensitive readout arrays.

Although indirect detection may be an improvement over the conventional analog technique using photographic films, this approach may suffer from deficiencies including low efficiency of the energy transfer and limited spatial resolution due to light spreading in the phosphor. The poor energy transfer is due to an inefficient process of creating and collecting visible light photons. The increased light spread is a consequence of increasing phosphor thickness to achieve better efficiency in stopping X-rays. The increased light spread can be ameliorated by use of specially grown CsI scintillators with a columnar structure when the X-rays have low energies and/or the CsI scintillators have thin layers. However, as soon as the aspect ratio (the length of the column to the diameter) increases (e.g., to account for increase in X-ray energies), the light collection within the scintillator columns decreases, further reducing the energy transfer efficiency.

Therefore, it is desirable to provide a digital X-ray detector that can provide efficient energy detection over a wide range of X-ray intensities and improved spatial resolution over phosphor-based digital X-ray detectors.

SUMMARY

In an exemplary embodiment according to the present invention, a method is provided for fabricating a polycrystalline film in a thermal evaporation system. The polycrystalline film is capable of directly detecting radiation. The method includes placing source material in a container; evacuating the container to create vacuum within the container; and heating the source material to evaporate the source material, wherein the evaporated source material is deposited on a substrate. The polycrystalline film is used in as deposited form to detect the radiation.

In another exemplary embodiment according to the present invention, a thermal evaporation system for fabricating a polycrystalline film is provided. The polycrystalline film is capable of directly detecting radiation. The system includes a container adapted for creating vacuum within and for heating source material disposed therein; a furnace enclosing at least a portion of the container, the furnace being capable of heating the container to evaporate the source material; a substrate holder for holding the substrate, on which the evaporated source material is deposited for growth of the polycrystalline film; and a temperature controlling system for maintaining the source material and the substrate at respective predetermined temperature ranges to control a growth rate of the polycrystalline film.

In yet another exemplary embodiment according to the present invention, a radiography system is provided. The radiography system includes an array detector capable of receiving radiation and generating corresponding electrical signal, the array detector comprising a polycrystalline film fabricated through sublimation on a readout substrate, wherein the polycrystalline film is used in as deposited form after being grown on said readout substrate; and an image processor coupled to the array detector to generate a displayable image from the electrical signal.

BRIEF DESCRIPTION OF THE DRAWINGS

These and other aspects of the invention may be understood by reference to the following detailed description, taken in conjunction with the accompanying drawings, which are briefly described below.

DETAILED DESCRIPTION

Figure 1:
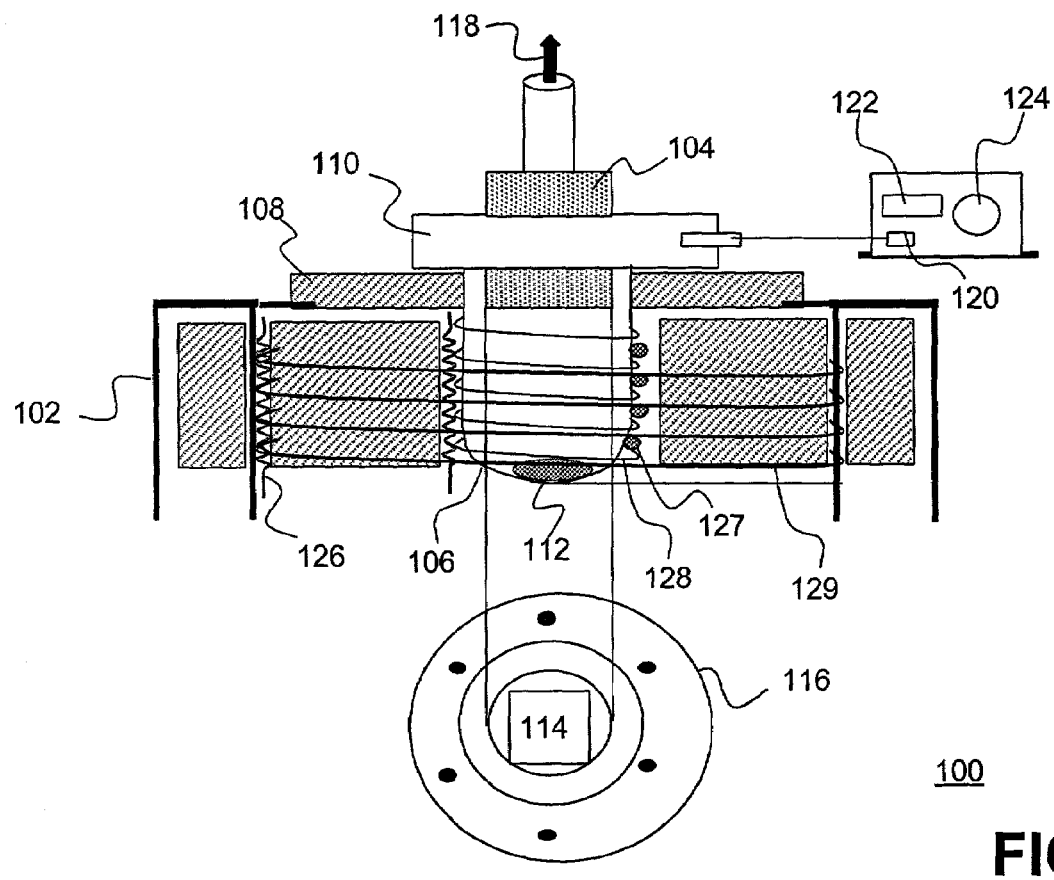
FIG. 1 is a schematic drawing of a thermal evaporation system, which may be used to fabricate $HgI_2$ polycrystalline films in an embodiment according to the present invention.

In an exemplary embodiment according to the present invention, a method and apparatus for fabricating polycrystalline film-based digital X-ray detectors are provided. The polycrystalline film-based digital X-ray detectors are used for efficient detection of X-ray images at high spatial resolution.

Polycrystalline films are grown through sublimation of a source material on substrates such as silicon and alumina. The source material used may be highly purified $HgI_2$ in powder form. Other metallic iodides such as lead iodide ($PbI_2$) may also be used as the source material to produce other types of polycrystalline films. The source material in a glass ampoule is evaporated onto a substrate using a furnace of a thermal evaporation system. The substrate may comprise amorphous silicon with a TFT (thin film transistor) array or a CMOS (complementary metal-oxide semiconductor) array fabricated thereon. These arrays may be used as readout arrays when the polycrystalline film is used in a digital X-ray detector for direct detection of X-rays without using a phosphor screen.

The thickness of the grown layers, size of the grains and crystallinity can be regulated in a controlled way over a wide range without the need for heat-treating (e.g., sintering) the layers after growth by adjusting the growth parameters such as $T_{source}$, $T_{substrate}$, source-substrate distance, and growth rate in specific reproducible ways. Thus, the polycrystalline films may be used in "as deposited" form to detect radiation. Detectors made from these films typically give dark current densities in the order of a few $pA/cm^2$ up to several hundred $pA/cm^2$ (pico amps/$cm^2$) and apparent resistivities in the order of $10^{10}$ to $10^{14}$ Ohms-cm. X-ray sensitivity results also show these detectors have good performance. For example, low dark current, good sensitivity and linearity of the response to X-rays allow $HgI_2$ polycrystalline layers to be used in digital X-ray imaging systems.

The deficiencies associated with indirect detection may be minimized or eliminated through the use of direct conversion detectors in an embodiment according to the present invention. Thin polycrystalline films of high atomic number (high Z) and high-density semiconductor material can effectively absorb the incoming X-ray radiation and convert it directly into electrical signals, which can be read by associated readout arrays.

The efficiency of the energy transfer from X-rays to electrical signal can be an order of magnitude larger in the direct detection approach than in the case of indirect detection using phosphors due to the basic underlying physics. That is, the mean energy for creation of an electron-hole pair in a semiconductor detector is typically an order of magnitude lower than the corresponding energy necessary to generate the same signal through the scintillation approach. This results in a larger signal for the same incoming X-ray event for the direct detector approach.

The direct detector approach can significantly improve detective quantum efficiency (DQE) despite the fact that indirect detectors can achieve DQE as high as 60–80 percent. DQE values are usually quoted for very high intensities of incident X-ray photons (photon limited case). DQE is a function of the number of photons interacting with the detector and drops significantly at lower X-ray intensities. Although DQE improves with the polycrystalline semiconductor converters compared to other technologies for the whole range of the incident X-ray intensities, the DQE improves the most at lower X-ray intensities. More efficient energy conversion and better signal-to-readout noise would allow direct detection to result in better detecting method.

The improved DQE at lower intensities may be important for applications such as fluoroscopy, where the dynamic temporal aspect of the measurement favors shorter measurement times. Another important consideration for direct detectors is that the charges generated by X-rays do not spread laterally (aside from negligible spreading due to diffusion) but move instead along the applied electric field lines. Spreading of the light in the indirect scintillator approach is a well-known factor causing deteriorated spatial resolution. Thus, the direct approach offers better spatial resolution than the indirect approach. It also allows for construction of thicker, more efficient detectors without any loss in resolution due to lateral spread in the detector.

Several high Z amorphous and polycrystalline semiconductor materials may be used for this application including thallium bromide (TlBr), amorphous selenium (a-Se), lead iodide (PbI$_2$), cadmium zinc telluride (CdZnTe), and mercuric iodide (HgI$_2$). Of these, HgI$_2$ polycrystalline films should be used for X-ray converters due to basic characteristics of the material.

HgI$_2$ may offer the most efficient energy transfer due to high X-ray stopping power and low mean energy required for electron-hole pair generation, low dark currents, and good long-term stability with a proper surface passivation. The remaining parameters, including mobility lifetime product for electrons and holes are among the highest of all of the candidate materials. In addition, HgI$_2$ can be easily deposited by low temperature thermal evaporation without altering its stoichiometry during the sublimation process.

Before the polycrystalline film is grown on a substrate, the source material should be purified so that the growth process may use the purest possible source material. For example, in an exemplary embodiment according to the present invention, the polycrystalline film is grown using mercuric iodide (HgI$_2$) powder with impurity concentration of major active contaminants of less than approximately 10 parts per million (PPM). In this embodiment, to purify the HgI$_2$ used for growth of the polycrystalline films, the starting compounds including mercury and iodine, such as, for example, mercuric chloride (HgCl$_2$) and potassium iodide (KI), respectively, should be highly purified.

Then the HgI$_2$ should be synthesized using the highly purified starting compounds (e.g., HgCl$_2$ and KI). In other embodiments, source compounds other than HgCl$_2$ and KI may be purified, then used to synthesize HgI$_2$. An exemplary process for preparation of HgI$_2$ is disclosed in N. L. Skinner et al., "Preparation and Evaluation of Mercuric Iodide for Crystal Growth," Nucl. Instr. & Meth. A283 (1989) pp. 119–122, the contents of which are fully incorporated by reference herein.

Then HgI$_2$ may be purified through the "4XMS" process disclosed in H. A. Lamonds, "Review of Mercuric Iodide Development Program in Santa Barbara," Nucl. Instr. & Meth. 213 (1983) pp. 5–12, the contents of which are fully incorporated by reference herein. The "4XMS" purification process includes HgI$_2$ vacuum sublimation under continuous evacuation, then thermal breakdown and coalescing of impurities in the molten HgI$_2$ when the HgI$_2$ is melted and then cooled, and finally filter sublimation under vacuum in a closed system. The filtering sublimation, for example, may be through a ceramic frit in an evacuated and sealed glass tube.

Separation between HgI$_2$ and the impurities occurs during vaporization because different materials vaporize at different temperatures. For example, HgI2 vaporizes at lower temperature than most impurities in this case. Further, some impurities coalesce and form larger particles than HgI$_2$, and so they don't make it through the ceramic frit.

In other embodiments, other processes known to those skilled in the art may be used to purify the source compounds and the synthesized HgI$_2$. In still other embodiments, other metallic iodides, such as, for example, lead iodide PbI$_2$ or other suitable high Z amorphous and/or polycrystalline semiconductor materials may be used to fabricate the polycrystalline film on a substrate. In each case, highly purified stoichiometric molecules are formed, and then sublimed to grow the polycrystalline film on a substrate.

FIG. 1 is a schematic drawing of a thermal evaporation system 100, which may be used to grow polycrystalline films, such as, for example, HgI$_2$ polycrystalline films, in an exemplary embodiment according to the present invention, using a thermal evaporation method. The thermal evaporation system 100 includes a furnace 102, which is used to heat up source material 112 (e.g., HgI$_2$ powder) for evaporation through sublimation to grow polycrystalline films on a substrate 114. An ampoule (bell jar) 106, which may be made of Pyrex glass, is used to contain the source material 112, which should be in powder form.

Vacuum 118 is applied to the ampoule after loading the source material 112 but before the growth process takes place. The furnace should be temperature controlled within a predetermined range of temperatures. Prior to and during the growth process, the ampoule 106 is sealed so that the vacuum is maintained within the ampoule. The sealed ampoule 106 should not contain undesirable impurities, such as, for example, organic based (carbon-based) and metallic based materials.

The substrate 114 may be fabricated from silicon, alumina, glass or other suitable materials, and may contain circuitry for electronic readout of the x-ray produced signals. When the alumina substrate is used, it may be thinly coated with palladium to provide metal contacts. In a further embodiment the contact and the HgI$_2$ may have a blocking barrier formed between them by coating the contact with a thin layer of an insulator material such as "parylene" in order to control the flow of current between the HgI$_2$ and the contact and to prevent chemical reaction between the HgI$_2$ and the contact. In one exemplary embodiment, said insulator layer is deposited over the entire substrate containing the contact.

The ampoule 106 should be mounted such that its opening surrounds a substrate holder and cooler 104, which is used to hold the substrate 114. The surface of the substrate holder and cooler 104 which interfaces with the substrate may, for example, comprise Teflon®. Teflon® is a registered trademark of E. I. du Pont de Nemours and Company, a Delaware corporation having a place of business at 101 West 10$^{th}$ St., Wilmington, Del. 19898. The cross section 116 illustrates the substrate 114 held in place by the substrate holder and cooler 104 situated at the opening of the ampoule 106, which abuts a top holder 110. The top holder 110, for example, may be made of stainless steel.

The substrate temperature controller 122 should be used to control the temperature of the substrate 114 to be at a predetermined temperature or within a range of predetermined temperatures by controlling the temperature of the substrate holder and cooler 104. Therefore, the substrate holder and cooler 104 includes an active cooler controlled by the substrate temperature controller 122. A digital thermometer 120 may be used to monitor the temperature of the substrate 114, and may provide feedback control capability to the substrate temperature controller 122. The top holder 110 holds the substrate holder and cooler 104 over the furnace 102, and an insulator 108 keeps the stainless steel holder 110 substantially insulated from the furnace 102.

In another exemplary embodiment according to the present invention, an additional heating element 128 is situated at the outside of the growth ampoule 106. The heating element may have a resistive device separating elements 126 and thermocouples 127 placed at various points in the furnace and/or on the ampoule 106 in order to control and maintain a fixed three-dimensional temperature profile within the growth ampoule 106.

A thermocouple switch may be used to switch between different thermocouples to monitor temperatures. In an embodiment where there are multiple digital thermometers each for measuring different thermocouple temperatures at various places in the furnace, the thermocouple switch 124 may not be needed.

It should be noted that in this and other embodiments, the process of fabricating polycrystalline films (e.g., $HgI_2$ films) are completed upon growth of the film through the evaporation process in the thermal evaporation system of FIG. 1. In other words, in these embodiments of the present invention, no further post-deposit processing on the polycrystalline film, such as, for example, heat-treatment (e.g., sintering) to form a single, coherent, continuous coherent film, is required or used to produce the X-ray sensitive digital detector. Further insulation and ambient temperature and environmental controls may be used in other embodiments.

In preparation for film growth, the substrates may be coated with a thin layer of palladium on one side to serve as the rear electrical contact to the polycrystalline film. In embodiments wherein the polycrystalline film is grown on readout arrays, such as, for example, TFT arrays on amorphous silicon or CMOS arrays, palladium coating may not be needed since these readout arrays typically already contain metal (e.g., palladium (Pd), Indium Tin Oxide (ITO), or Titanium Tungsten (TiW)) contacts. In certain embodiments the contact and the $HgI_2$ may have a blocking barrier formed between them by coating the contact with a thin layer of an insulator material such as "parylene" in order to control the flow of current and to partially isolate the $HgI_2$ from the contact. In one exemplary embodiment, said insulator layer is deposited over the entire substrate containing the contact.

The prepared (e.g., palladium coated) substrates are mounted in the substrate holder and cooler 104 as seen in the cross sectional illustration 116 of FIG. 1. The ampoule 106, which may also be referred to as a growth ampoule, should be loaded with the source material 112 (e.g., high purity grade mercuric iodide ($HgI_2$) in powder form) and evacuated to, for example, between $10^{-5}$ and $10^{-7}$ Torr and more particularly, between $5 \times 10^{-5}$ and $5 \times 10^{-6}$ Torr.

Prior to loading the source material, the growth ampoule should be cleaned with aqua regia or other suitable cleanser, rinsed with distilled water, and then baked for 12 hours at 300° C. The baking should remove moisture and/or other impurities remaining in the ampoule. In other embodiments, the number of hours and temperature used for baking may be different. For example, the number of baking hours may be inversely proportional to the temperature used for baking.

The ampoule 106 (after loading the source material 112) should be placed inside the furnace 102, which may also be referred to as a resistance furnace, and should be kept at $T_{source}$, while the substrate is cooled (relative to the furnace 102 and the source material 112) to be at a separately controlled temperature, $T_{substrate}$.

Several crystal growth parameters including $T_{source}$, $T_{substrate}$, source-substrate distance, and vacuum may be adjusted to adjust the film growth rate and to improve conditions for film growth. For example, the temperature and distance ranges may be between 100° C. and 220° C. for the $T_{source}$, between 10° C. and 130° C. for the $T_{substrate}$, and between 7 cm and 15 cm for the source-substrate distance. The growing time may range from 25 to 120 minutes, depending on $T_{source}$ and intra-ampoule pressure after evacuation.

The ranges for source temperature and substrate temperature for growth in an exemplary embodiment according to the present invention are as follows. The range for the source temperature $T_{source}$ is 120° C. to 160° C. Although higher temperatures may result in higher growth rates, films at high temperatures may exhibit internal stresses, which in turn may cause adhesion failures. The range for the substrate temperature $T_{substrate}$ is 20° C. to 85° C. These conditions should result in a reasonable growth rate of approximately 2 to 5µm/min.

Substrate temperatures higher than 90° C. may produce incomplete film deposition, resulting in non-uniform growth of the film. In addition, substantially uniform temperature should be maintained throughout the substrate for uniform growth of the film. In other embodiments, precise temperatures may be achieved and maintained throughout the 3-D volume using additional heating elements, thermocouples, and controls.

It should be noted that the substrate temperature $T_{substrate}$ of substantially higher than 100° C. may adversely affect the TFT array on the substrate. Further, it should be noted that $HgI_2$ may have an undesirable chemical reaction with some material, such as, for example, gold (Au) or aluminum (Al), if they are present during the film growth process either as impurities or in the readout array. Materials such as, for example, palladium, indium tin oxide (ITO), indium oxides and tin oxides typically do not react with $HgI_2$, and may be used on the readout arrays.

In an exemplary embodiment according to the present invention, the physical characteristics of the produced $HgI_2$ polycrystalline film such as film thickness, grain size and texture may be controlled and verified. In other embodiments, other characteristics of the film may be controlled and verified as well. In this embodiment, films are characterized by optical microscopy for grain size and uniformity, powder X-ray diffraction for crystallinity, and radiation transmission for thickness gauging.

The optical microscopy may be performed using a high power microscope with a digital camera. For example, the high power microscope used may be Olympus® BH2-UMA microscope and the digital camera used may be Kodak® DC 120 digital camera. Olympus® is a registered trademark of Olympus Optical Co., Ltd, a Japanese Joint Stock Company having at 2-chome, Hatagaya, Shibuya-ku, Japan. Kodak® is a registered trademark of Eastman Kodak Company, a New Jersey corporation having a place of business at 343 State Street, Rochester, N.Y.

It can be seen from the optical microscopy that the polycrystalline films are made of a number of grains, each individual grain typically comprising a single crystal. The grain size (ave±σ) has been measured for a number of polycrystalline films. The measured grain size ranges from (11±5) to (160±90) µm depending on the growth parameters with smaller grain sizes resulting when the substrate is cooler. In other embodiments, grain size can be controlled by adjusting the source-substrate temperature gradient, the vacuum, and the source to substrate distance.

Figure 2:
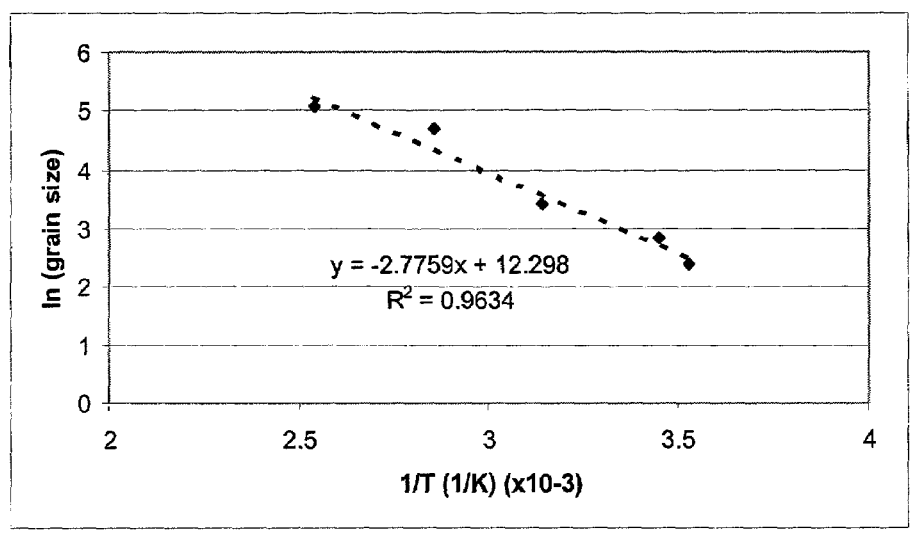
FIG. 2 is a graph illustrating correlation between grain size and substrate temperature for polycrystalline $HgI_2$ film grown by thermal evaporation in an embodiment according to the present invention.

Through the optical microscopy characterization, it has been determined that the grain size of the $HgI_2$ layers can be regulated in a controllable and repeatable fashion from 11 to 160µm in an exemplary embodiment by selecting the substrate temperature, as illustrated, for example, in FIG. 2. FIG. 2 illustrates a graph 150 of natural logarithm (ln) of the grain size in µm versus 1/T, where T is the substrate temperature in units of (Kelvin×$10^{-3}$).

The grain size of 11 µm may be suitable for polycrystalline films deposited on TFT arrays, which may be formed on amorphous silicon substrate, and may provide adequate spatial resolution for digital radiography in many medical applications. While either very small grains (factor of one or more less than the readout pitch, and may be a factor of two or more less than the readout pitch) or a large single crystal that covers many, and possibly all the readout pixels may be the most suitable for matching to a pixelated readout, the spatial resolution of the digital X-ray detector may depend on grain sizes as well as the pitch of the readout arrays, e.g., TFT arrays. For example, typical TFT arrays may have 127μm pitch, even though TFT arrays may also have other pitches ranging from a few microns to a few hundred microns depending on the fabrication technology and process used and the application that the TFT arrays are targeted to.

Figure 3:
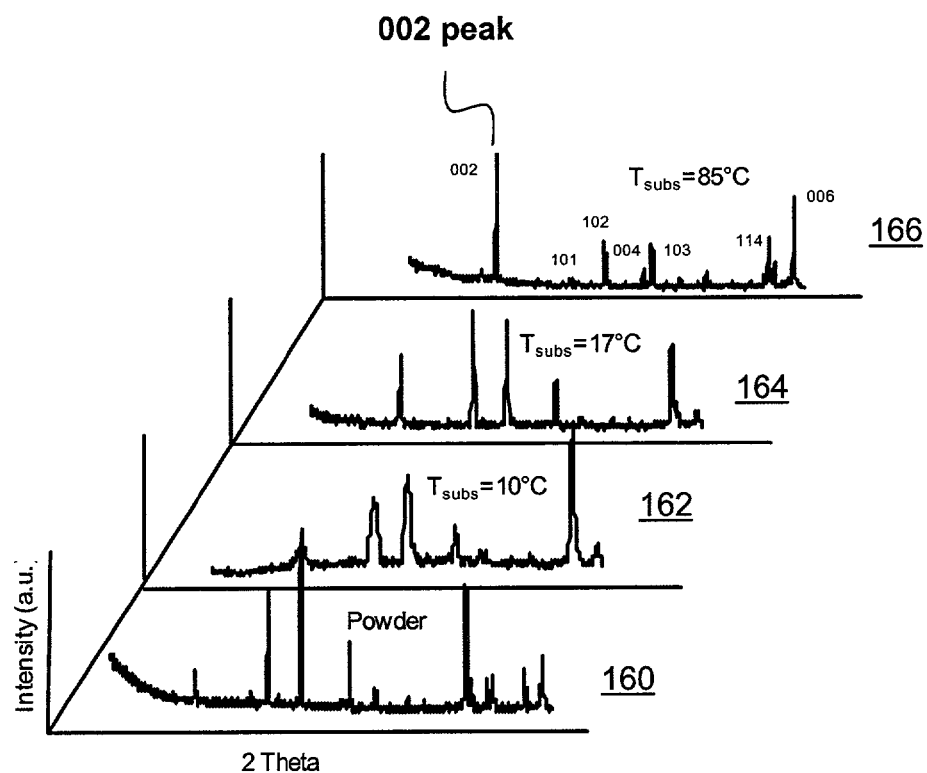
FIG. 3 illustrates X-ray diffraction diagrams for films grown at different substrate temperature in an embodiment according to the present invention.

FIG. 3 illustrates an X-ray diffraction diagram 160 for a powder sample and X-ray diffraction diagrams 162, 164 and 166 for polycrystalline films. The X-ray diffraction diagrams 162, 164 and 166 represent films grown at the substrate temperatures of 10° C., 17° C., 85° C., respectively. The X-ray powder diffraction may be performed for grown films using a diffractometer, such as for example, a Siemens® Diffractometer. Siemens® is a registered trademark of Siemens Aktiengesellschaft, a German corporation having a place of business at Wittelsbacherplatz 2 Munich, Germany.

Figure 4:
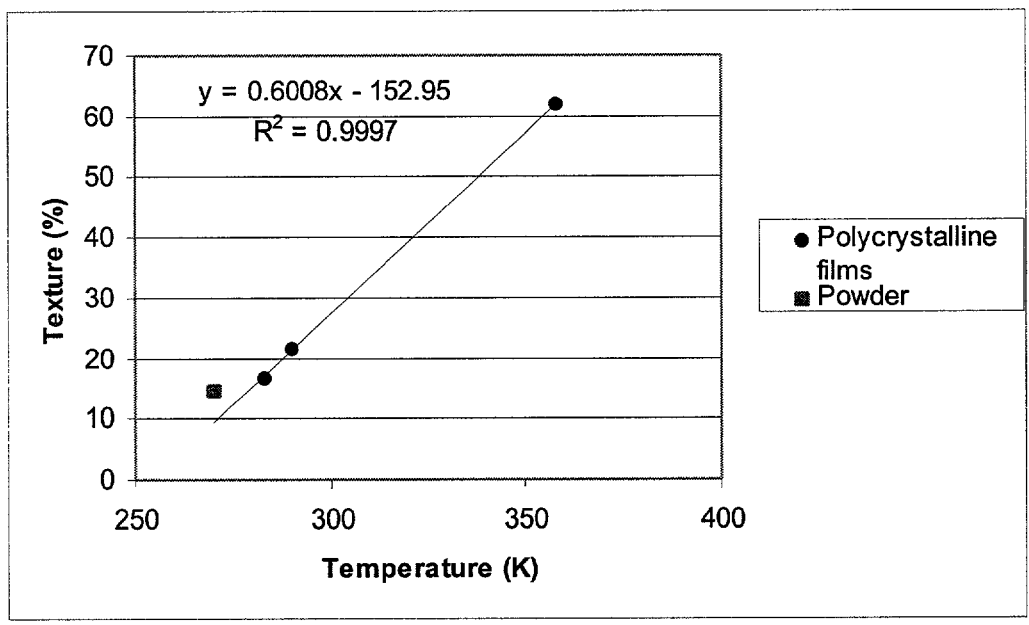
FIG. 4 is a graph illustrating polycrystalline $HgI_2$ film textures as function of substrate temperature in an embodiment according to the present invention.

For each film, the texture may be estimated according to: $[\Sigma(0\ 0l)/\Sigma(h\ k\ l)]$, which measures orientation of crystal, measuring peaks in different spectra. In FIG. 4, this relationship is plotted against substrate temperature (during film growth), and a correlation between the preferred orientation of the crystal with C-axis perpendicular to the substrate and substrate temperature can be deduced. An increase in preferred orientation with C-axis perpendicular to the substrate is observed with increasing temperature. See for example (002) peaks in FIG. 3. The texture value for the powder (which is random) may be used as reference as seen in FIG. 4. As can be seen from FIG. 4, the crystallographic orientation of the film and texture may be regulated towards better values by selection of the substrate temperature.

Figure 5:
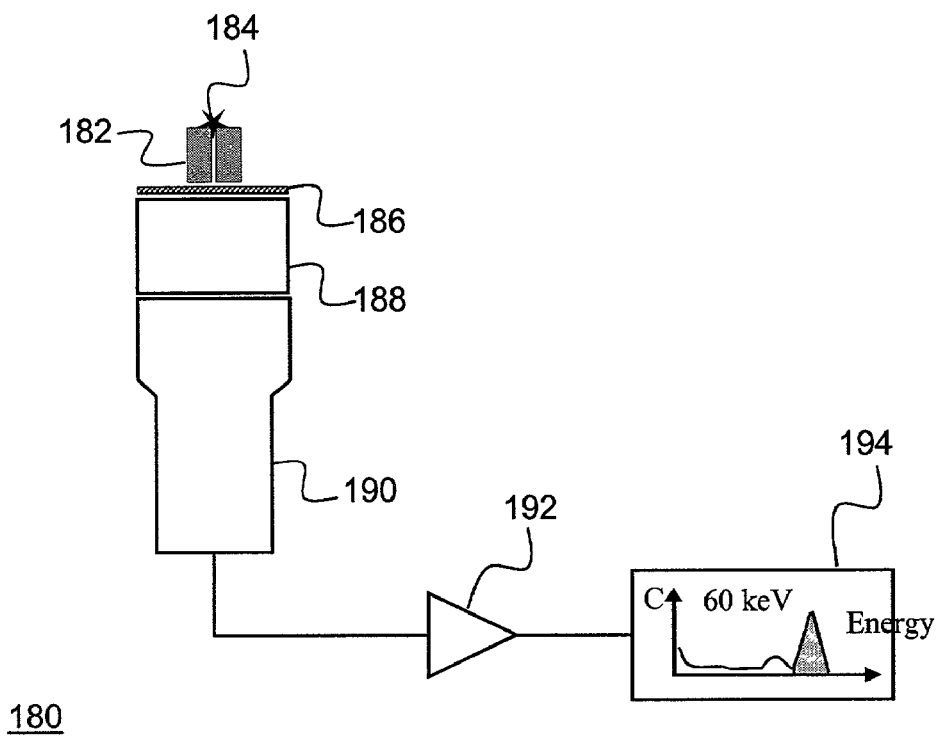
FIG. 5 illustrates a set up for measuring thickness of polycrystalline $HgI_2$ films in an embodiment according to the present invention.

FIG. 5 illustrates a set up for measuring thickness of a polycrystalline film, such as, for example a polycrystalline $HgI_2$ film. Film thickness may be determined by using the set up of FIG. 5 via a radiation transmission method using a highly collimated ($\Phi$=0.5 mm) $^{241}$Am source (60 keV) 184. The $^{241}$Am source 184 should be collimated by a collimator 182. The gamma rays passed through a $HgI_2$ polycrystalline film 186 should be detected using a 1"×1" CsI(Na) scintillation crystal 188 coupled to a photomultiplier tube (PMT) 190 whose signal is then processed using a preamplifier, 192 that conditions the signal suitably so that it may be further connected to a multi-channel analyzer (MCA) 194, on which the resulting energy spectrum may be recorded.

The attenuation of gamma rays in the layers may be obtained by subtracting the integral number of counts in the 60 keV photopeak transmitted through a substrate with a $HgI_2$ deposited layer on it from the integral number of counts in the same photopeak window transmitted through a similar but bare substrate with no $HgI_2$ deposited on it.

By use of the well-known value of the linear attenuation coefficient at 60 keV in $HgI_2$ the thickness of the films may be determined. Also, by making several collimated measurements at various locations over the surface of the grown layers, their uniformity may be measured as well. The thickness of the grown layers may vary depending on the growth conditions from 50 to 150 μm and the uniformity of thickness (±σ/mean %) in the layers may be less than +/–2% over a 4-in² area.

Figure 6:
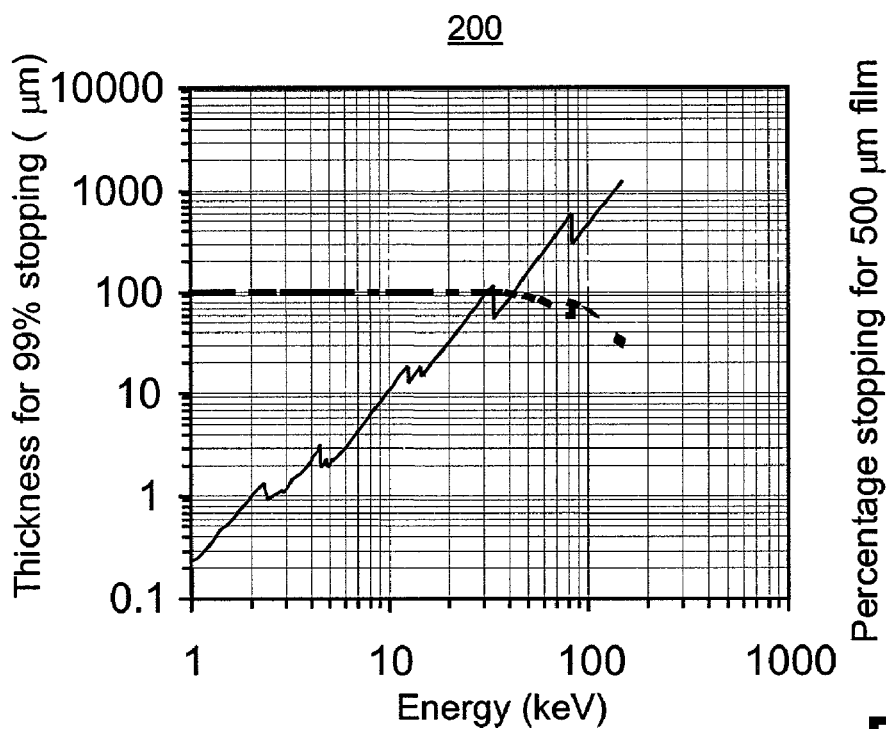
FIG. 6 is a graph illustrating thickness of $HgI_2$ required for 99% stopping of X-ray energy and percentage stopping for a 500 μm $HgI_2$ film.
Figure 8:
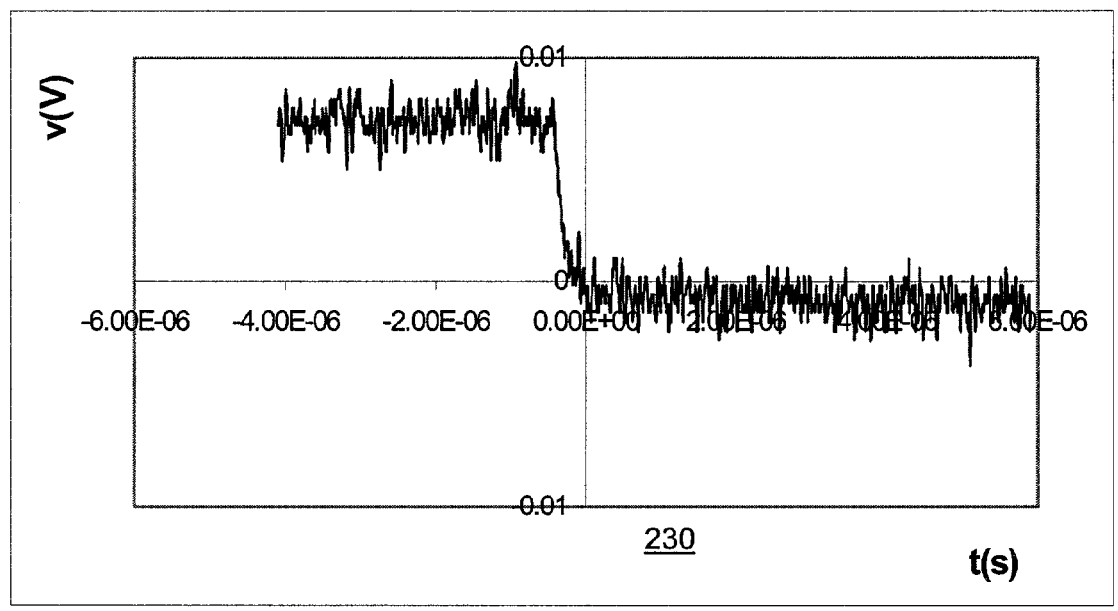
FIG. 8 is a graph illustrating a voltage pulse from a polycrystalline $HgI_2$ film in an embodiment according to the present invention measured with a fast-rise time preamplifier as collected by a digital oscilloscope.

FIG. 6 illustrates thickness of $HgI_2$ required for 99% stopping versus energy (solid line) and percentage stopping for a 500 μm $HgI_2$ film versus energy (dashed line). FIG. 8 (solid line) shows the film thickness (μm) required for 99% stopping in $HgI_2$ as a function of X-ray energy. Film thickness of 150μm is sufficient for 99% stopping up to 50 keV.

In fact, at X-ray mammography energies (17 keV for Mo anode X-ray tubes and 21 keV for Ag anode X-ray tubes) even 50 μm thin film may stop more than 99% of the X-rays. However, in order to obtain high efficiency for X-ray energies in the 100 keV range (150 μm gives between 70%–35% attenuation in the 100–150 keV region) thicker layers are preferred.

For example, for taking breast images in mammography, the film thickness of 20 to 50μm may be sufficient to detect adequate X-ray energy. However, when taking body images in radiography, X-ray energies in the range of 100 keV may be used, and the film may need to have a thickness of few hundred μm.

Palladium front contacts may be deposited onto the $HgI_2$ films by thermal evaporation using a vacuum coating unit, such as, for example, an Edwards Vacuum Coating Unit (Model E306A), under a vacuum of, for example, $10^{-4}$ to $10^{-6}$ Torr, and more particularly $10^{-5}$ Torr.

Two or more kinds of contacts may be deposited onto several films. First, larger contacts covering the whole or part of the film area may be deposited for studying the X-ray ray response and uniformity of the films. After verifying an acceptable response, array contacts with sizes from a few microns² up to a few mm² each may be deposited to further study film uniformity and image capabilities. Readout may be accomplished using TFT, CMOS, or other such technology.

The $HgI_2$ polycrystalline detectors may be characterized by measuring the basic electrical properties such as dark current, resistivity, mobility, mobility-lifetime, and the linearity and sensitivity of response to X-rays. Dark current may be measured as a function of the applied voltage for all grown films by applying bias voltage between the front (entrance) and back electrodes. The measurements may be carried out using a DC voltage power supply and a Pico ammeter, which for example may be a Keithley® Model 487. Keithley® is a registered trademark of Keithley Instruments, inc., an Ohio corporation having a place of business at 12415 Euclid Ave., Cleveland, Ohio.

Figure 7:
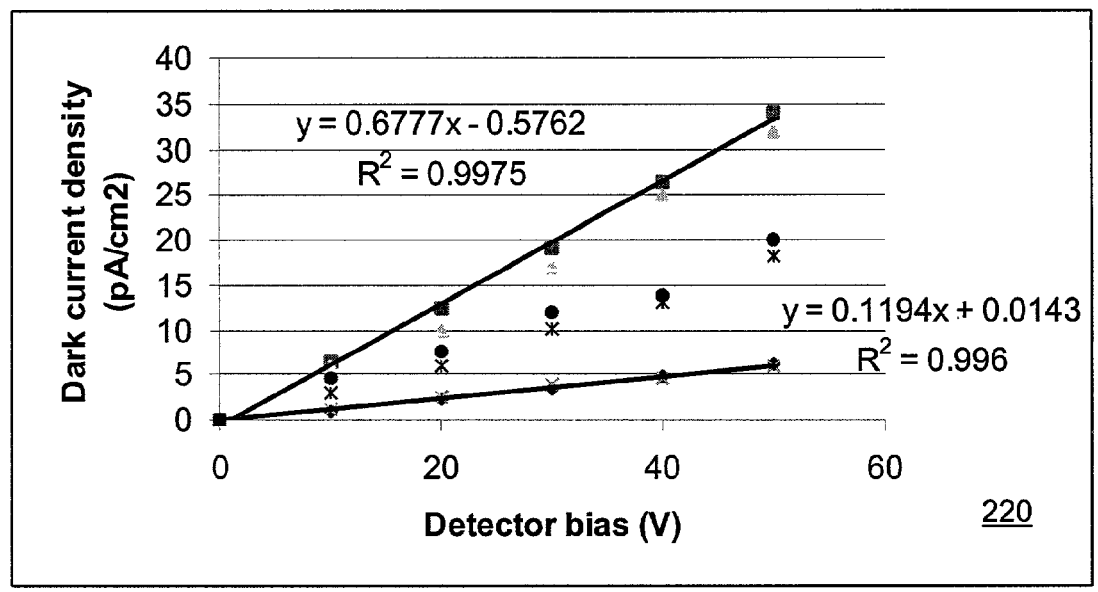
FIG. 7 is a graph illustrating dark current density versus detector bias for several detectors and films.

FIG. 7 illustrates a graph of dark current density versus detector bias for 1×1 cm² detectors for several representative films. It can be seen from FIG. 7 that the film dark current is on the order of a few pA/cm² and that the apparent resistivity range of the films is $1\times10^{14}$ to $6\times10^{14}$ ohm-cm. The film dark current obtained for three films is almost three orders of magnitude better (lower) than dark current values reported previously by those skilled in the art. In addition, apparent resistivities are higher than reported data ($2\times10^{12}$ ohm-cm). This may be due to the use of highly purified $HgI_2$ as starting (source) material and preparation of the polycrystalline films according to the present invention.

The mobility of charge carriers may be measured by irradiating the $HgI_2$ film using beta particles from a $^{204}$Tl source. A pixel electrode may be connected to a fast preamplifier, and the pulses resulting from the interaction of the beta particles in the film may be displayed and recorded on a digital oscilloscope, which for example may be Tektronix® Model TDS 380, 400 MHz. Tektronix® is a registered trademark of Tektronix, Inc., an Oregon corporation having a place of business at 14200 SW KARL BRAUN DRIVE (50-LAW), Beaverton, Oreg. 97077. Charge carrier mobility may be calculated according to $\mu=L^2/TV$ where L is the thickness of the layer, V the bias voltage and T the risetime.

FIG. 8 illustrates an example of a captured pulse in this measurement set up, which is a voltage pulse from fast-risetime pre-amplifier collected by the digital oscilloscope (electron collection). The waveform corresponds to generation and transport of electrons in the HgI$_2$ layer, from which a mobility of 16 cm$^2$/Vs can be obtained. This is a good charge transport value for a polycrystalline film, especially when compared with electron mobilities obtained for HgI$_2$ monocrystals (2.1 cm$^2$/Vs$\leq \mu e \leq$125 cm$^2$/Vs) known to those skilled in the art.

The mobility-lifetime product of charge carriers may be calculated using the same beta particle source measurement by means of the Hecht relation, given by $$Q/Q_0 = (\mu\tau E/L)(1-\exp(-L/\mu\tau E))$$

where Q is the collected charge, $Q_0$ is the charge generated initially and E is the electric field (bias voltage divided by the film thickness L). $Q_0$ may be determined experimentally by finding asymptotic value at high bias voltages where signal no longer increases. By fitting the measured data to the Hecht relation mobility-lifetime values of 6×10$^{-5}$ cm$^2$/V may be calculated, which may be similar to values obtained with HgI$_2$ monocrystals as well as obtained for other HgI$_2$ layers (4×10$^{-5}$ cm$^2$/V, 6.8×10$^{-5}$ cm$^2$/V) as those skilled in the art would appreciate.

The response of Polycrystalline HgI$_2$ detectors to X-rays may be determined by measuring the response (detector current) to X-rays from an X-ray generator, as a function of the tube voltage (for example, in the range of 10–150 kV) and as a function of the detector's applied bias. Linearity of response may be characterized as a function of the X-ray exposure by making measurements as a function of the X-ray tube current. The exposure rate may be calibrated using a calibrated camera, such as, for example, RAD-CHECK® Plus, Model 06-526. RAD-CHECK® is a registered trademark of Victoreen, Inc. an Ohio Corporation having a place of business at 1505 Jefferson Ave., Toledo Ohio 43697

Figure 9:
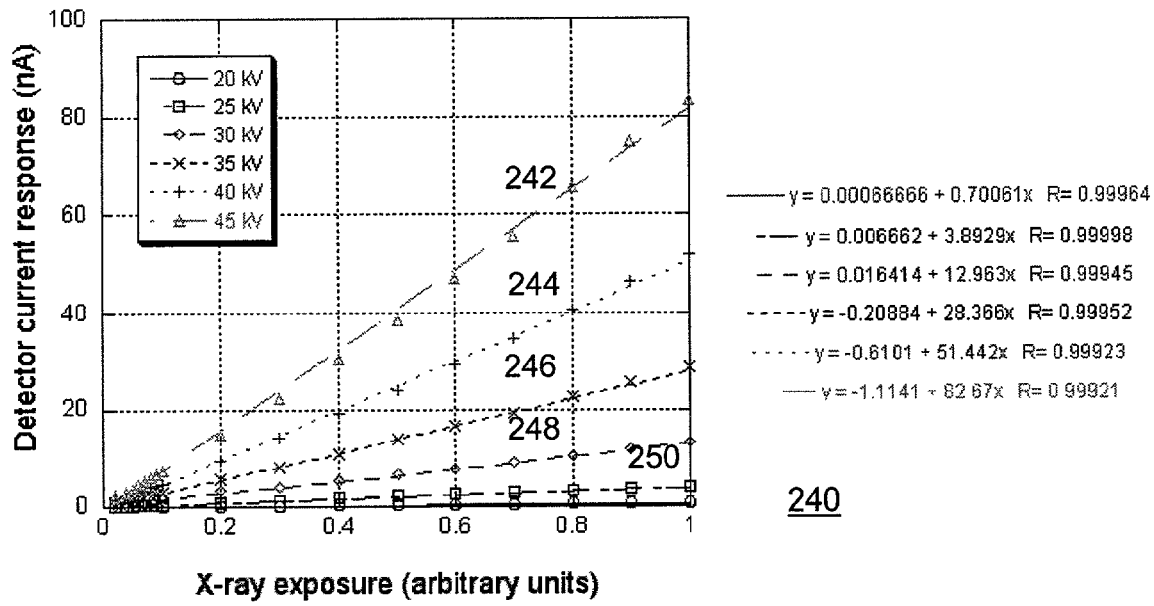
FIG. 9 is a graph illustrating X-ray response linearity for different kV at X-ray tube.

FIG. 9 shows the X-ray response linearity for a representative film sample. X-rays impinging the detector are pre-filtered with a 1.7 mm Aluminum plate filter. The detector current may then be measured with a Pico ammeter, such as, for example, Keithley model 487.

Figure 10:
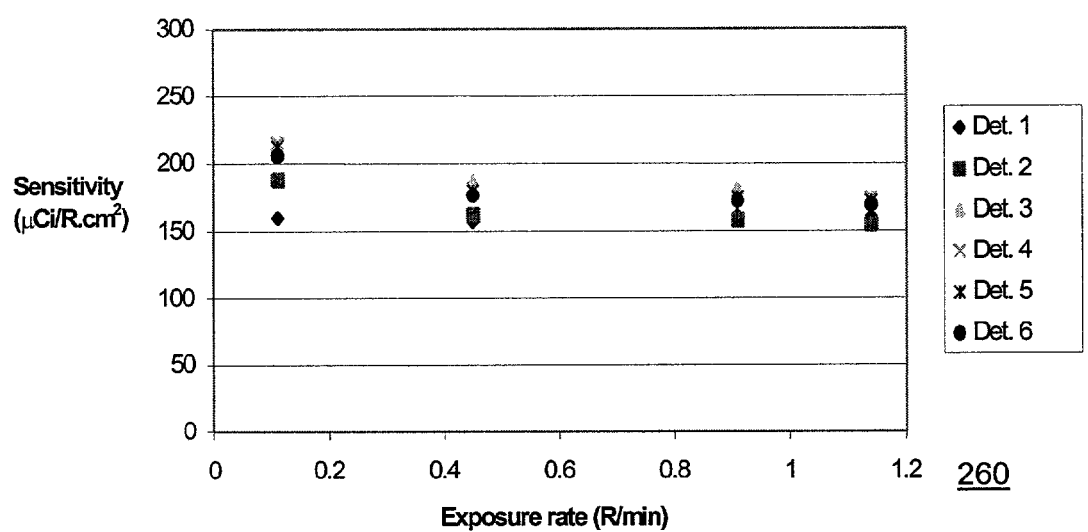
FIG. 10 is a graph illustrating X-ray sensitivity measurements in an embodiment according to the present invention.

FIG. 10 shows the X-ray sensitivity versus exposure for several representative detectors. The X-ray response uniformity with exposure rate is very good and very repeatable for many detectors. The measured values of sensitivity compare very well with these of mercuric iodide films and with other materials (PbI$_2$ and a-Se) known to those skilled in the art.

Figure 11:
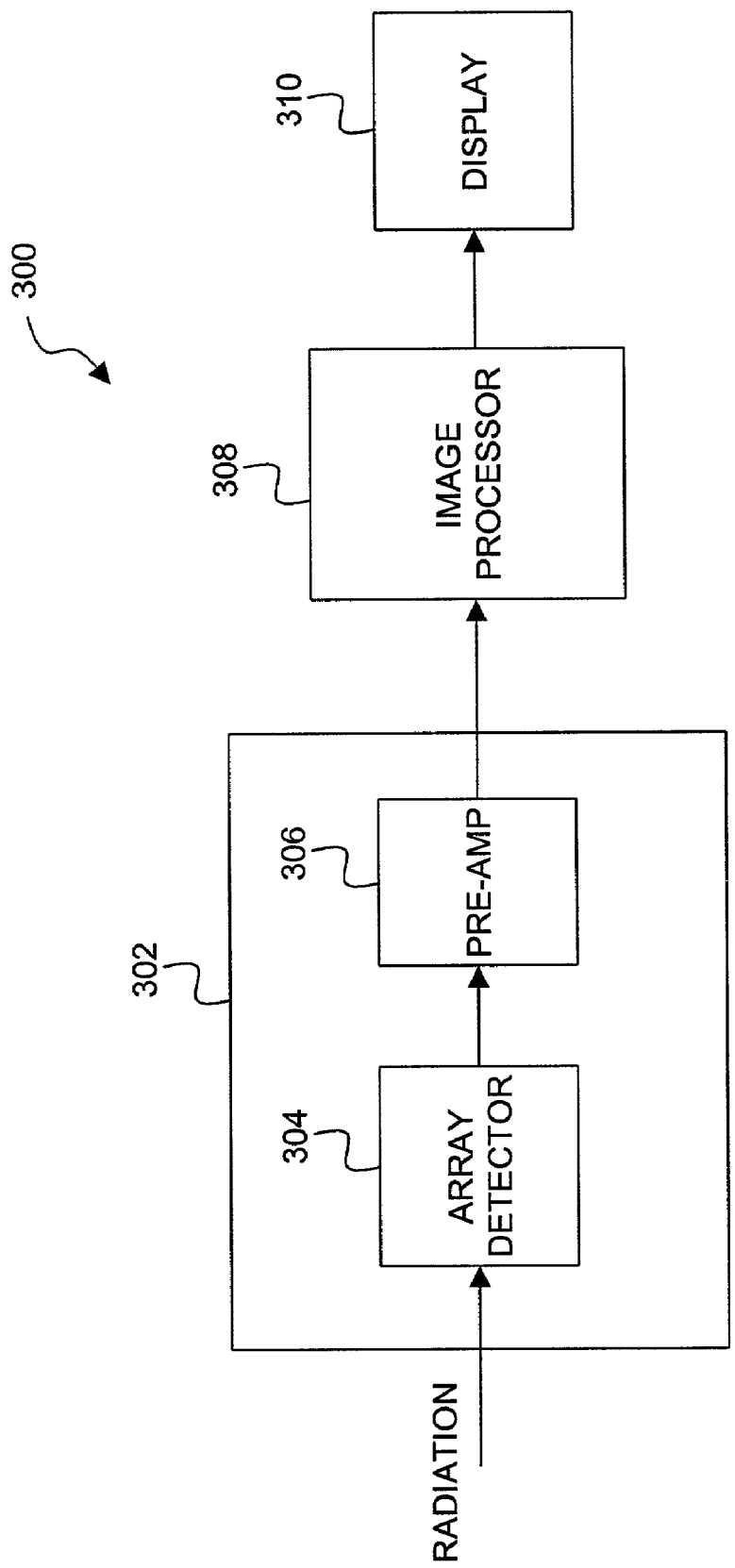
FIG. 11 is a block diagram of a digital radiography system, in which an exemplary embodiment according to the present invention may be applied.

FIG. 11 is a block diagram of a digital radiography system 300, in which an exemplary embodiment according to the present invention may be applied. The digital radiography system 300 includes a radiation detector 302 and an image processor 308. The image processor 308 may be coupled to a display 310 for displaying processed radiographic images. The digital radiography system 300, for example, may be used for X-ray imaging applications.

The radiation detector 302 includes an array detector 304 and one or more pre-amplifiers 306. The array detector 304 may include the HgI$_2$ polycrystalline film fabricated according to an exemplary embodiment of the present invention for direct detection of radiation to generate electrical signals for the radiographic images. The electrical signals may be processed by pre-amplifiers 306 and applied to the image processor 308 for further processing to generate displayable images.

Figure 12:
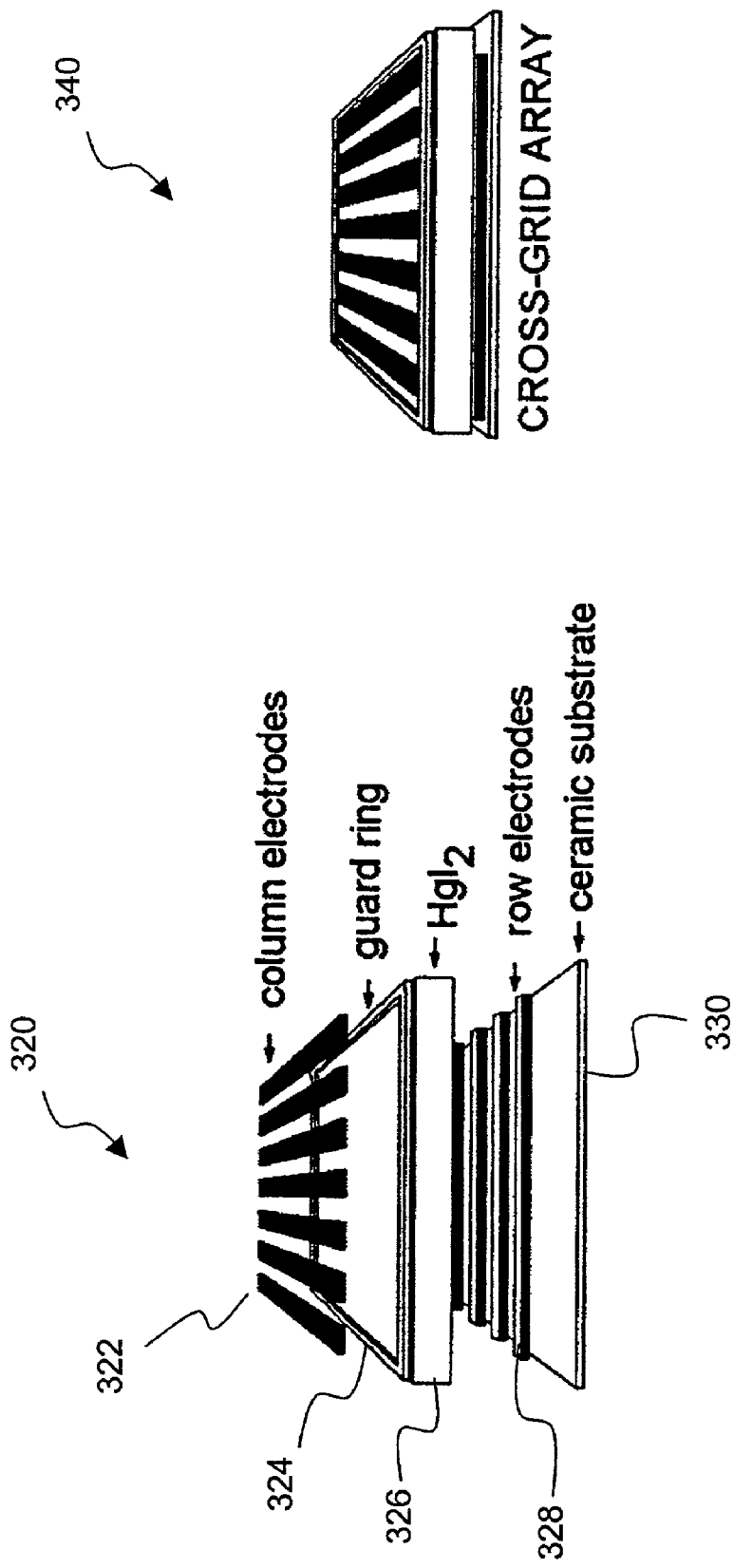
FIG. 12 is a detailed block diagram of the digital radiography system of FIG. 11.

FIG. 12 illustrates an array detector 340, which may be fabricated using the HgI$_2$ polycrystalline film fabricated according to an exemplary embodiment of the present invention. The HgI$_2$ polycrystalline film, for example, may be capable of directly detecting X-ray. The array detector 320 is a blow up drawing of the array detector 340. The array detector 320 includes column electrodes 322, a guard ring 324, a HgI2 polycrystalline film 326, row electrodes 328 and a ceramic substrate 330. The ceramic substrate 330, for example, may be made of alumina or any other suitable ceramic substrate, and may be attached to a printed circuit board in practice.

The column and row electrodes may be fabricated by using a photolithographic technique. The electrodes may also be fabricated by evaporating, for example, Pd (palladium) contacts onto the HgI$_2$ polycrystalline films through physical masks. As illustrated in FIG. 12, the detector array 320 may be constructed in a cross-grid array configuration with row electrodes on the front side, and column electrodes on the back side.

Figure 13:
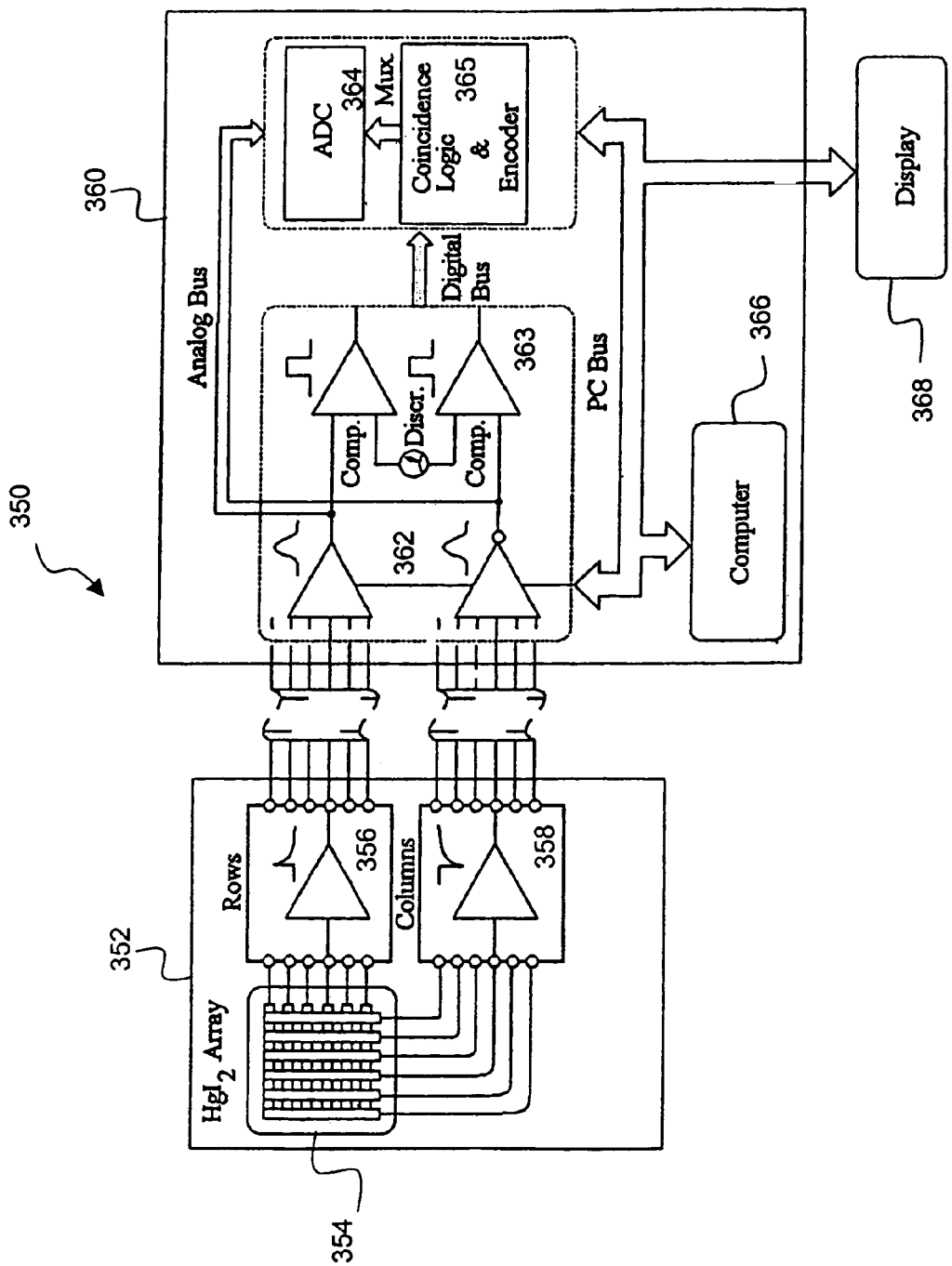
FIG. 13 is a block diagram of a prior art digital radiography system, in which an exemplary embodiment according to the present invention may be applied.

FIG. 13 is a block diagram of a prior art digital radiography system 350, in which an exemplary embodiment according to the present invention may be applied. The digital radiography system 350 includes a radiation detector 352 and an image processor 360. The digital radiography system 350, for example, may be used for X-ray imaging applications.

The radiation detector 352 includes an array detector 354, which may include HgI$_2$ polycrystalline film fabricated according to an exemplary embodiment of the present invention and have the configuration of the array detector 320 of FIG. 12. The array detector 354 includes row and column electrodes, and are coupled to row multi-channel pre-amps 356 and column multi-channel pre-amps 358, respectively. The pre-amps 356 and 358 may be charge sensitive pre-amps.

The outputs of the pre-amps 356 and 358 are coupled to shaping amplifiers 362 and digital signal generators 363 in the image processor 360 for generation of digital signals that indicate occurrence of events. The output of the shaping amplifiers 362 are also provided to an ADC (analog-to-digital converter) 364 to generate corresponding digital signals. A coincidence logic & encoder 365 generates displayable images by correlating the outputs from the digital signal generators 363 and the ADC 364, and encoding the correlated output. A computer 366 may be used to control image processing, and the images may be displayed on a display 368.

Figure 14:
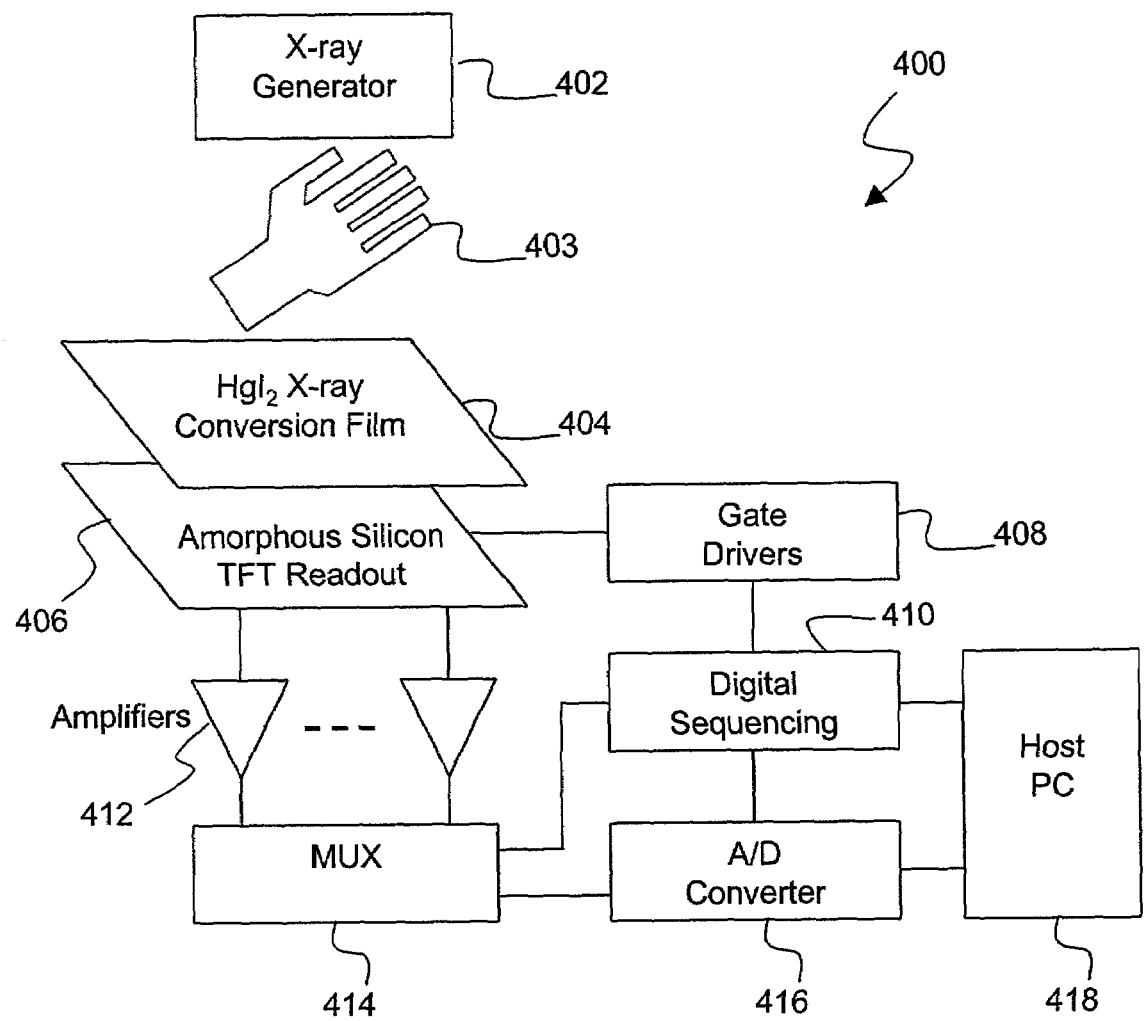
FIG. 14 is a block diagram of a digital radiography system with an amorphous silicon TFT readout in which an exemplary embodiment according to the present invention may be applied.

FIG. 14 is a block diagram of a digital radiography system 400 utilizing an amorphous silicon TFT (thin film transistor) readout 406 in which an exemplary embodiment according to the present invention may be applied.

A radiation detector 404 formed of a HgI2 polycrystalline film is deposited on the TFT readout 406. An X-Ray Generator 402 produces x-ray radiation, which is attenuated by an object 403 under examination. The resulting image obtained with the detector 404 is read out with the help of the TFT readout 406 and associated electronics.

The readout electronics includes the following components: amplifiers 412, a multiplexer 414, gate drivers 408, digital sequencer 410, and an A/D converter 416. The image is displayed and stored in a host computer 418.

In the digital radiography system 400 in an exemplary embodiment, a plurality of readout electrodes may be formed on the TFT readout 406. Further, a single electrode may be formed on the polycrystalline film. When a bias voltage is applied between the first and second electrodes, it creates an electric field within the polycrystalline film, and the electric field facilitates signal formation in response to an x-ray radiation. In other embodiments, a plurality of electrodes may be formed on the polycrystalline film. The digital radiography system 400 may also includes a plurality of pre-amplifiers, each of which is capable of processing signal from one of the readout electrodes.

In the digital radiography system 400 in another exemplary embodiment, a plurality of readout electrodes may be formed on TFT readout 406. A thin layer of insulator material may be coated on the readout substrate by depositing the insulator material on a surface of the TFT readout on which the first electrodes are formed. The thin layer of insulator material forms a blocking barrier between the first electrodes and the polycrystalline film in order to control a flow of current and to chemically isolate the polycrystalline film from the first electrodes.

It will be appreciated by those of ordinary skill in the art that the invention can be embodied in other specific forms without departing from the spirit or essential character hereof. The present description is therefore considered in all respects to be illustrative and not restrictive. The scope of the invention is indicated by the appended claims, and all changes that come within the meaning and range of equivalents thereof are intended to be embraced therein.

We claim:

1. A method of fabricating a compound semiconductor polycrystalline film in a thermal evaporation system, the polycrystalline film being capable of directly detecting radiation, the method comprising:
   placing a source material in a container;
   evacuating the container to create vacuum within the container; and
   heating the source material to evaporate the source material, wherein the evaporated source material is deposited on a substrate to form the polycrystalline film, and wherein the polycrystalline film is used without post deposition heat treatment to detect the radiation.

2. The method according to claim 1, further comprising purifying the source material prior to placing it in the container.

3. The method according to claim 2, wherein purifying comprises purifying through 4XMS purification.

4. The method according to claim 2, wherein purifying comprises:
   subliming the source material in vacuum, thereby removing impurities from the source material;
   melting the source material, whereby remaining impurities are separated from the source material;
   cooling the molten source material;
   subliming the cooled source material; and passing the sublimed source material through a ceramic flit but not the impurities.

5. The method according to claim 1, wherein the source material comprises mercuric iodide ($HgI_2$).

6. The method according to claim 1, further comprising synthesizing the source material from starting compounds, wherein the starting compounds are purified prior to the synthesis of the source material.

7. The method according to claim 6, wherein the starting compounds comprise mercuric chloride ($HgCl_2$) and potassium iodide (KI).

8. The method according to claim 1, further comprising controlling temperature of the substrate within a predetermined range.

9. The method according to claim 8, wherein the predetermined temperature range for the substrate is between 20° C. and 85° C.

10. The method according to claim 8, wherein controlling temperature of the substrate comprises maintaining a substantially uniform temperature throughout the substrate.

11. The method according to claim 1, wherein heating comprises maintaining temperature of the source material within a predetermined range.

12. The method according to claim 11, wherein the predetermined temperature range for the source material is between 120° C. and 160° C.

13. The method according to claim 1, wherein evacuating comprises evacuating the container to between $10^{-5}$ Torr and $10^{-7}$ Torr.

14. The method according to claim 1, wherein the substrate is fabricated from material selected from a group consisting of silicon, glass and alumina.

15. The method according to claim 1, wherein the substrate has electronic readout circuitry formed thereon.

16. The method according to claim 15, wherein the electronic readout circuitry is based on a technology selected from a group consisting of TFT and CMOS technologies.

17. The method according to claim 1, wherein the polycrystalline film is capable of directly detecting X-rays by converting the X-rays to an electrical signal.

18. The method of claim 1, wherein the thermal evaporation system comprises:
   the container adapted for creating vacuum within and for heating the source material disposed therein;
   a furnace enclosing at least a portion of the container, the furnace being capable of heating the container to evaporate the source material;
   a substrate holder for holding the substrate, on which the evaporated source material is deposited for growth of the polycrystalline film; and
   a temperature controlling system for maintaining the source material and the substrate at respective predetermined temperature ranges to control a growth rate of the polycrystalline film.

19. The method according to claim 18, wherein the temperature controlling system comprises:
   at least one thermocouple for measuring temperature in the furnace;
   a heating element capable of controlling the temperature about the container; and
   a cooler adapted to control the temperature of the substrate to be within the predetermined temperature range for the substrate to control the growth rate of the polycrystalline film.

20. The method according to claim 19, wherein the thermal evaporation system further comprises a temperature controller for controlling the heating element and the cooler in response to the measured temperature.

21. The method according to claim 18, wherein the thermal evaporation system further comprises a vacuum system for maintaining vacuum within the container.

22. The method according to claim 1, further comprising controlling a temperature of the substrate to be within a predetermined temperature range through controlled cooling during the deposition.

23. A radiography system comprising:
   an array detector capable of receiving radiation and generating corresponding electrical signal, the array detector comprising a compound semiconductor polycrystalline film fabricated in a thermal evaporation system by:
   placing a source material in a container;
   evacuating the container to create vacuum within the container; and heating the source material to evaporate the source material, wherein the evaporated source material is deposited on a readout substrate to form the polycrystalline film, wherein the polycrystalline film is used without post deposition heat treatment to detect the radiation; and an image processor coupled to the array detector to generate a displayable image from the electrical signal.

24. The radiography system according to claim 23, further comprising:

a plurality of first electrodes formed on the readout substrate; and a second electrode formed on the polycrystalline film, wherein a bias voltage applied between the first and second electrodes creates an electric field within the polycrystalline film, said electric field facilitating signal formation in response to an x-ray radiation.

25. The radiography system according to claim 23, further comprising a plurality of first electrodes formed on the substrate and a plurality of second electrodes formed on the polycrystalline film, wherein the first and second electrodes are disposed perpendicularly to one another.

26. The radiography system according to claim 23, further comprising:

a plurality of first electrodes formed on the readout substrate; and a thin layer of insulator material coated on the readout substrate by depositing said insulator material on a surface of the readout substrate on which the first electrodes are formed, wherein the thin layer of insulator material forms a blocking barrier between the first electrodes and the polycrystalline film in order to control a flow of current and to chemically isolate the polycrystalline film from the first electrodes.

27. The radiography system according to claim 24, further comprising a plurality of pre-amplifiers, each pre-amplifier capable of processing signal from one of the first electrodes.

28. The radiography system according to claim 24, further comprising a plurality of pre-amplifiers, each pre-amplifier capable of processing signal from one of the first and second electrodes.

29. The radiography system according to claim 23, wherein the image processor comprises an analog-to-digital converter for digitizing the electrical signal.

30. The radiography system according to claim 23, further comprising a display capable of displaying the displayable image.

31. The radiography system according to claim 23, wherein the radiation comprises X-ray.

32. A method of fabricating a compound semiconductor polycrystalline film in a thermal evaporation system, the polycrystalline film being adapted to directly detect radiation, the method comprising:

placing a source material in a container;

evacuating the container to create vacuum within the container;

heating the source material to evaporate the source material, wherein the evaporated source material is deposited on a substrate to form the polycrystalline film; and controlling a temperature of the substrate during the deposition to be within a predetermined temperature range through controlling an active cooler, such that the polycrystalline film is adapted to be used without sintering to detect the radiation.

33. The method according to claim 32, wherein the predetermined temperature range for the substrate is between 20° C. and 85° C.

34. The method according to claim 32, wherein the polycrystalline film is a substantially continuous polycrystalline film.

* * * * *

UNITED STATES PATENT AND TRADEMARK OFFICE
CERTIFICATE OF CORRECTION

PATENT NO. : 7,186,985 B2
APPLICATION NO. : 10/158494
DATED : March 6, 2007
INVENTOR(S) : Iwanczyk et al.

It is certified that error appears in the above-identified patent and that said Letters Patent is hereby corrected as shown below:

On the Title Page, item

(57) Abstract, line 4          After "to create",
                               Insert --a--

In the Claims

Column 13, line 30, Claim 1    After "to create",
                               Insert --a--

Column 13, line 44, Claim 4    Before "vacuum",
                               Insert --a--

Column 13, line 49, Claim 4    Delete "; and passing",
                               Insert --; and
                                 passing--

Column 13, line 50, Claim 4    Delete "flit",
                               Insert --frit--

Column 14, line 26, Claim 18   Before "vacuum",
                               Insert --a--

Column 14, line 54, Claim 21   Before "vacuum",
                               Insert --a--

Column 14, line 66, Claim 23   Before "vacuum",
                               Insert --a--

Column 15, line 38, Claim 27   After "processing",
                               Insert --a--

Column 16, line 3, Claim 28    After "processing",
                               Insert --a--

UNITED STATES PATENT AND TRADEMARK OFFICE
CERTIFICATE OF CORRECTION

PATENT NO. : 7,186,985 B2
APPLICATION NO. : 10/158494
DATED : March 6, 2007
INVENTOR(S) : Iwanczyk et al.

It is certified that error appears in the above-identified patent and that said Letters Patent is hereby corrected as shown below:

Column 16, line 18, Claim 32    Before "vacuum",
                                Insert --a--

Column 16, line 27, Claim 32    Delete "sintering",
                                Insert --post deposition heat treatment--

Signed and Sealed this

Twenty-second Day of September, 2009

David J. Kappos
*Director of the United States Patent and Trademark Office*